(12) United States Patent
Kawata

(10) Patent No.: US 9,666,428 B2
(45) Date of Patent: May 30, 2017

(54) DISPLAY DEVICE

(71) Applicant: Japan Display Inc., Minato-ku (JP)

(72) Inventor: Yasushi Kawata, Tokyo (JP)

(73) Assignee: Japan Display Inc., Minato-ku (JP)

( * ) Notice: Subject to any disclaimer, the term of this patent is extended or adjusted under 35 U.S.C. 154(b) by 16 days.

(21) Appl. No.: 14/585,603

(22) Filed: Dec. 30, 2014

(65) Prior Publication Data

US 2015/0194392 A1 Jul. 9, 2015

(30) Foreign Application Priority Data

Jan. 7, 2014 (JP) .................................. 2014-000857

(51) Int. Cl.
| | |
|---|---|
| *H01L 21/31* | (2006.01) |
| *H01L 21/02* | (2006.01) |
| *H01L 51/00* | (2006.01) |
| *H01L 51/52* | (2006.01) |
| *H01L 27/32* | (2006.01) |

(52) U.S. Cl.
CPC ........ *H01L 21/022* (2013.01); *H01L 27/3244* (2013.01); *H01L 51/003* (2013.01); *H01L 51/0097* (2013.01); *H01L 51/5253* (2013.01); *H01L 27/322* (2013.01); *H01L 2224/18* (2013.01); *H01L 2251/5338* (2013.01); *H01L 2251/566* (2013.01); *H01L 2924/0002* (2013.01); *Y02E 10/549* (2013.01); *Y02P 70/521* (2015.11)

(58) Field of Classification Search
None
See application file for complete search history.

(56) References Cited

U.S. PATENT DOCUMENTS

| | | | |
|---|---|---|---|
| 5,712,206 A | * | 1/1998 | Chen ................... H01L 23/291 |
| | | | 148/DIG. 55 |
| 5,760,643 A | | 6/1998 | Whetsel |
| 5,969,538 A | | 10/1999 | Whetsel |
| 5,994,912 A | | 11/1999 | Whetsel |
| 6,046,600 A | | 4/2000 | Whetsel |
| 6,166,557 A | | 12/2000 | Whetsel |
| 6,262,587 B1 | | 7/2001 | Whetsel |
| 6,326,801 B1 | | 12/2001 | Whetsel |
| 6,987,382 B1 | | 1/2006 | Whetsel |
| 2001/0052787 A1 | | 12/2001 | Whetsel |

(Continued)

FOREIGN PATENT DOCUMENTS

| | | |
|---|---|---|
| JP | 2005-178363 | 7/2005 |
| JP | 2007-088491 | 4/2007 |

*Primary Examiner* — Reema Patel
(74) *Attorney, Agent, or Firm* — Oblon, McClelland, Maier & Neustadt, L.L.P.

(57) ABSTRACT

According to one embodiment, a display device includes a first multilayer, second multilayer, and filler layer. The first multilayer includes a first barrier layer formed on a surface of the resin layer and a switching element formed above the first barrier layer. The second multilayer includes a second barrier layer which is substantially the same as the first barrier layer with respect to layering order, material, and thickness. The filler layer is positioned between the first multilayer and the second multilayer. A layering structure of the first barrier layer and a layering structure of the second barrier layer are symmetrical to each other with respect to the switching element.

9 Claims, 6 Drawing Sheets

(56) References Cited

U.S. PATENT DOCUMENTS

| | | |
|---|---|---|
| 2002/0024356 A1 | 2/2002 | Whetsel |
| 2004/0201397 A1 | 10/2004 | Whetsel |
| 2004/0232459 A1 | 11/2004 | Takayama et al. |
| 2005/0090075 A1 | 4/2005 | Takayama et al. |
| 2005/0258857 A1 | 11/2005 | Whetsel |
| 2005/0280434 A1 | 12/2005 | Whetsel |
| 2007/0109009 A1 | 5/2007 | Whetsel |
| 2007/0138954 A1 | 6/2007 | Takayama et al. |
| 2007/0285113 A1 | 12/2007 | Whetsel |
| 2007/0296441 A1 | 12/2007 | Whetsel |
| 2008/0204065 A1 | 8/2008 | Whetsel |
| 2010/0195033 A1 | 8/2010 | Takayama et al. |
| 2010/0203235 A1* | 8/2010 | Verschuuren ....... H01L 51/5212 427/66 |
| 2010/0237362 A1* | 9/2010 | Okabe ............... G02F 1/133345 257/88 |
| 2010/0327908 A1 | 12/2010 | Whetsel |
| 2012/0286315 A1 | 11/2012 | Takayama et al. |
| 2013/0049804 A1 | 2/2013 | Whetsel |

\* cited by examiner

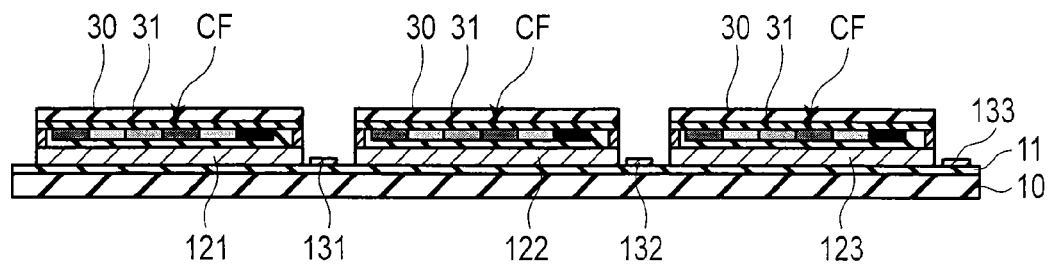
F I G. 7
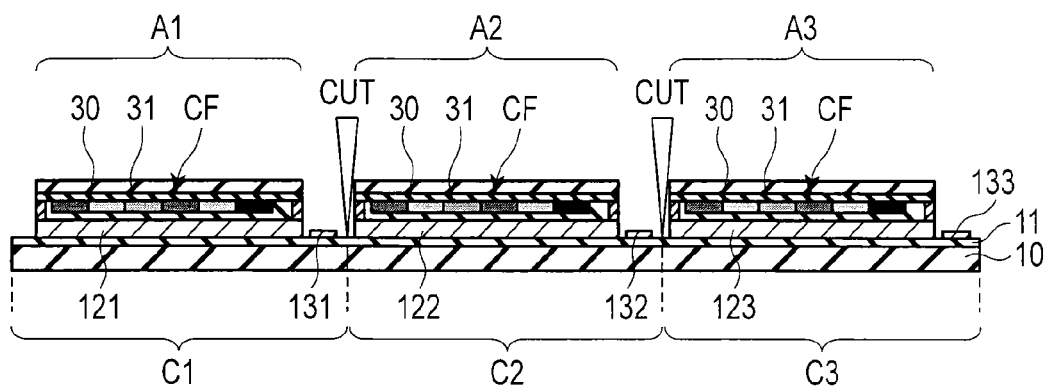
F I G. 8

DISPLAY DEVICE

CROSS-REFERENCE TO RELATED APPLICATIONS

This application is based upon and claims the benefit of priority from Japanese Patent Application No. 2014-000857, filed Jan. 7, 2014, the entire contents of which are incorporated herein by reference.

FIELD

Embodiments described herein relate generally to a display device and a method of manufacturing the same.

BACKGROUND

By virtue of such advantageous features as light weight, small thickness and low power consumption, flat-panel display devices, such as an organic electroluminescence (EL) display device and a liquid crystal display device, have been used in various fields of OA (office automation) equipment, information terminals, timepieces, and television receivers. In particular, by virtue of high responsivity, display devices using thin-film transistors (TFTs) are widely used as monitors of mobile terminals, computers, etc., which display a great deal of information.

In recent years, as regards mobile information terminal devices such as mobile phones and PDAs (personal digital assistants), there has been an increasing demand for a display device having a less thickness and a less weight, from the standpoint of design and portability, as well as performance. For example, display devices, which realize thinner structures, have been proposed. As a method of realizing a less thickness and less weight, there is known a technique wherein a resin layer formed of a polyimide with a relatively high heat resistance, or a plastic substrate, is used in place of a glass substrate. When a resin layer is formed of a polyimide, a resin layer using a polyimide is formed on a glass substrate. After TFTs, etc. are formed on the resin layer, the resultant structure is divided into cells, and at last the resin layer is peeled from the glass substrate. Thereby, the resin layer can be formed.

BRIEF DESCRIPTION OF THE DRAWINGS

FIG. 7 is a view which shows the method of manufacturing the display device, specifically illustrating a first supporting substrate of the first mother substrate and a second supporting substrate of the second mother substrate.

FIG. 8 is a view which shows the method of manufacturing the display device, specifically illustrating a process of dividing the first resin layer.

DETAILED DESCRIPTION

Figure 1:
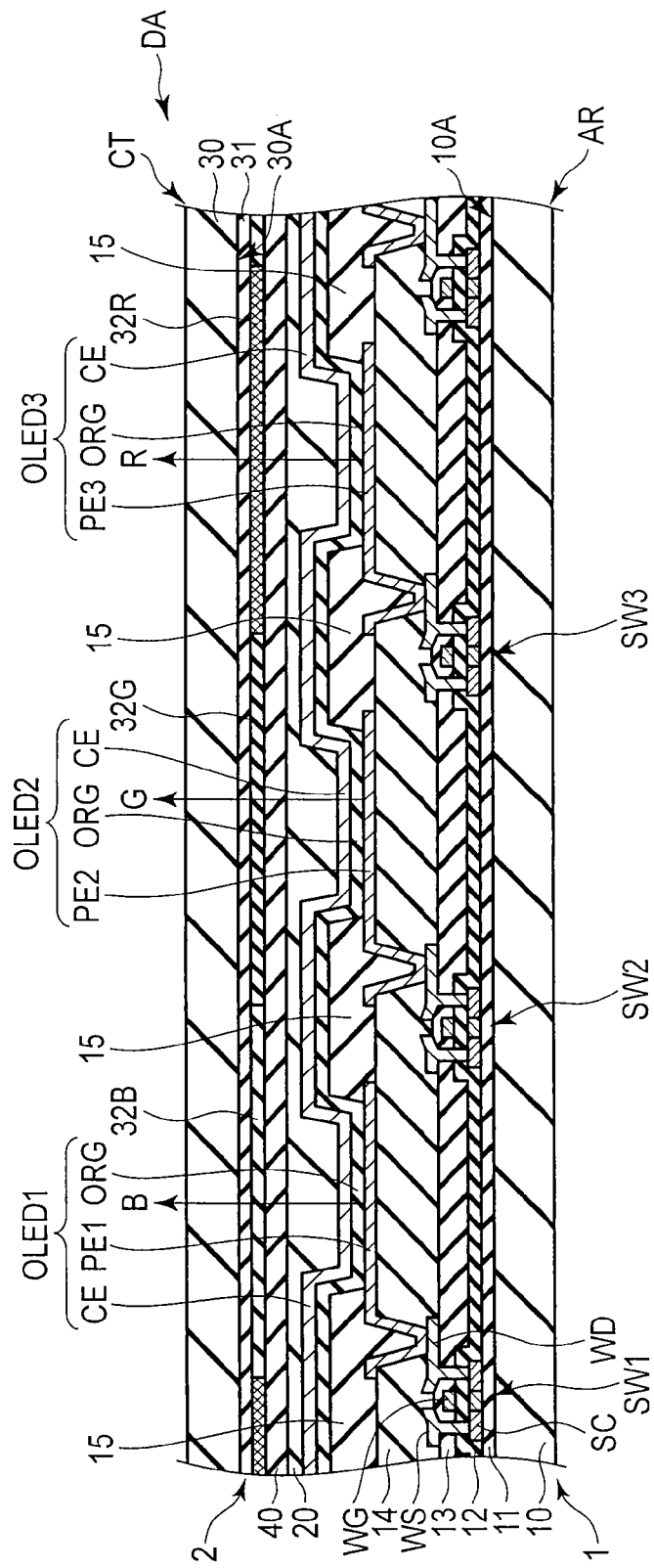
FIG. 1 is a cross-sectional view which schematically shows a structural example of a display device of first embodiment.

In general, according to one embodiment, there is provided a display device comprising: a first multilayer including a first barrier layer formed on a surface of a resin layer and a switching element formed above the first barrier layer; a second multilayer including a second barrier layer which is substantially the same as the first barrier layer with respect to layering order, material, and thickness; and a filler layer positioned between the first multilayer and the second multilayer, wherein a layering structure of the first barrier layer and a layering structure of the second barrier layer are symmetrical to each other with respect to the switching element.

According to another embodiment, there is provided a manufacturing method of a display device, the method comprising: forming a first barrier layer on a surface of a first resin layer and a switching element above the first barrier layer, and forming a first multilayer including the first barrier layer and the switching element; forming a second barrier layer on a second resin layer through the same manufacturing process with same manufacturing conditions as those of the first barrier layer, the second barrier layer being substantially the same as the first barrier layer with respect to layering order, material, and thickness, and forming a second multilayer including the second barrier layer; arranging the first multilayer and the second multilayer to be opposed to each other such that a layering structure of the first barrier layer and a layering structure of the second barrier layer are symmetrical to each other with respect to the switching element; and forming a filler layer between the first multilayer and the second multilayer to adhere the first multilayer and the second multilayer.

Hereinafter, embodiments are described with reference to the accompanying drawings. Note that the disclosure herein is for the sake of exemplification, and any modification and variation conceived within the scope and spirit of the invention by a person having ordinary skill in the art are naturally encompassed in the scope of invention of the present application. Furthermore, a width, thickness, shape, and the like of each element are depicted schematically in the Figures for the sake of simpler explanation as compared to actual embodiments, and they are not to limit the interpretation of the invention of the present application. Furthermore, in the description and Figures of the present application, structural elements having the same or similar functions will be referred to by the same reference numbers and detailed explanations of them that are considered redundant may be omitted.

Initially, a basic concept regarding embodiments of the present invention is explained.

A display device is manufactured by forming a thin-film transistor (TFT) and the like above a glass substrate or a resin layer. A first barrier layer is provided between the glass substrate or the resin layer and the TFT. The first barrier layer prevents contamination of TFT (diffusion of impurities from the glass substrate or the resin layer into the TFT). Furthermore, the first barrier layer functions as an undercoat layer (underlying insulating layer) which is electrically isolated from the TFT.

Here, as a substitute for a glass substrate of a display device, a substrate formed of a material of excellent flexibility is under keen development since there is a great demand for a display device with higher product reliability and better flexibility (that is, a crack-proof display device). As an example of other advantages, such a display device does not have a limitation in a product design or the like as compared to a display device with a glass substrate.

Roughly dividing, there are two kinds of manufacturing methods available for manufacturing a substrate of excellent flexibility, that is:

(1) using a plastic substrate (resin substrate) instead of a glass substrate; and (2) forming a resin layer (for example, polyimide resin layer) on a glass substrate and peeling off the resin layer from the glass substrate to substitute the resin layer for the glass substrate.

Note that, even when a display device is formed with such a plastic substrate or a resin layer, a first barrier layer is still formed thereon to prevent contamination of the TFT. The TFT is formed above the plastic substrate or the resin layer with the first barrier layer intervening therein. A display element may also be formed above the plastic substrate or the resin layer with the first barrier layer intervening therein.

Furthermore, a second barrier layer is disposed above the plastic substrate or the resin layer above which the element such as TFT is formed. The second barrier layer is an insulating layer to prevent external ion impurity impingement and moisture impingement. The second barrier layer prevents, for example, deterioration of the display element due to the moisture or the like.

However, there are some problems. For example, the display device formed as above would not be sufficiently excellent in the reliability standpoint. The second barrier layer is formed after the formation of the element such as TFT, and thus, a temperature used to form the second barrier layer is limited to a certain range for preventing thermal damage to its underlying elements. Since the second barrier layer is unable to be formed in a sufficiently high temperature, the barrier performance of the second barrier layer (fine structure of the second barrier layer) will be poor.

Furthermore, the display device formed as above would not be formed in a sustainable shape. The display device is composed of various films on the plastic substrate or the resin layer, and the various films show different stresses which cause warpage of the display device, and eventually the display device will be bent.

As can be understood from the above, the method of manufacturing the display device (the second barrier layer) as above will be difficult to produce a display device having excellent reliability and shape sustainability.

In the following embodiments, the cause of these problems is elucidated and the solution is presented to achieve a display device with excellent flexibility and a method of manufacturing the same. Or a display device with excellent product reliability and a method of manufacturing the same can be obtained. Now, the means and methods to solve the above problems are explained.

Here, a display device and a method of manufacturing the same of the first embodiment are explained in detail. FIG. 1 is a cross-sectional view which schematically shows a structural example of a display device DA of the present embodiment. The display device DA is an Organic EL display device as a sheet display. The cross-sectional structure of the Organic EL display device is explained with reference to FIG. 1.

As shown in FIG. 1, the Organic EL display device uses an active matrix driving method and includes an array substrate AR and a counter-substrate CT. The array substrate AR is formed of a first resin layer 10. At the inner surface 10A side of the first resin layer 10, the array substrate AR includes a first insulating film 11, second insulating film 12, third insulating film 13, fourth insulating film 14, rib 15, switching elements SW1 to SW3, and Organic EL elements OLED1 to OLED3 as display elements.

The first resin layer 10 is an insulating layer which is formed of a material mainly including, for example, polyimide (PI). The first resin layer 10 has a thickness of 5 to 30 μm. Instead of polyimide, high thermal resistive materials such as polyamide-imide and polyaramide can be applied to the first resin layer 10. That is, the first resin layer 10 is often exposed to a high temperature during processes such as formation of various insulating films, formation of a switching element, and formation of an Organic EL element. Thus, the most important characteristics required for the first resin layer 10 are flexibility and high thermal resistance. As described later, the Organic EL element is of so-called top emission type Organic EL element which emits light through the counter-substrate CT. Thus, the first resin layer 10 does not necessarily possess a high transparency and may have a color.

The inner surface 10A of the first resin layer 10 is covered with the first insulating film 11. The first insulating film 11 is formed on the surface of the first resin layer 10. The first insulating film 11 should preferably be formed on the first resin layer 10 with an adhesive force of 0.2 N/mm or less. The adhesive force is obtained through a 90° peeling test. The 90° peeling test is performed to measure a resistive force generated when the first insulating film 11 is peeled from the first resin layer 10 at a peeling angle of 90°, in a predetermined timing with a predetermined peeling speed. This test is performed to acquire an adhesive force convenient for a peeling process performed later at an interface between the first resin layer 10 and the first insulating film 11. What should be noted here is that if the adhesive force between the first resin layer 10 and the first insulating film 11 is too weak, it will cause an unintentional peeling due to a thermal, chemical, or physical stress in in-between processes.

The first insulating film 11 functions as a first barrier layer which suppress the ion impurity impingement from and the moisture impingement through the first resin layer 10. The first insulating film 11 is formed of inorganic materials such as silicon nitride ($SiN_x$), silicon oxide ($SiO_2$), and silicon oxynitride (SiON) and formed as a multilayer structure. For example, the first insulating film 11 is formed of a multilayer film including silicon nitride and silicon oxide layered one after another. The first insulating film 11 may be formed of other materials which securely function as a barrier.

Switching elements SW1 to SW3 are formed above the first insulating film 11. Switching elements SW1 to SW3 are each formed as a thin-film transistor (TFT) including a semiconductor layer SC. Switching elements SW1 to SW3 are structured the same and switching element SW1 is focused here to explain its structure in detail.

In the example depicted, switching element SW1 is formed as a top gate type TFT but may be formed as a bottom gate type TFT. The semiconductor layer SC is, for example, formed of a silicon material such as amorphous silicon and polycrystalinne silicon, or an oxide semiconductor which is an oxide including at least one of indium (In), gallium (Ga), and zinc (Zn).

The semiconductor layer SC is formed on the first insulating film 11 and is covered with the second insulating film 12. The second insulating film 12 also covers the first insulating film 11. Gate electrode WG of switching element SW1 is formed on the second insulating film 12. Gate electrode WG is covered with the third insulating film 13. The third insulating film 13 also covers the second insulating film 12.

Source electrode WS and drain electrode WD of switching element SW1 are formed on the third insulating film 13. Source electrode WS and drain electrode WD contact the source region and drain region of the semiconductor layer SC, respectively. Source electrode WS and drain electrode WD are covered with the fourth insulating film 14. The fourth insulating film 14 is provided on the third insulating film 13.

Organic EL elements OLED1 to OLED3 are formed on the fourth insulating film 14. In the example depicted, Organic EL element OLED1 is electrically connected with switching element SW1, Organic EL element OLED2 is electrically connected with switching element SW2, and Organic EL element OLED3 is electrically connected with switching element SW3. Organic EL elements OLED1 to OLED3 each emit white light. Organic EL elements OLED1 to OLED3 are structured the same.

Organic EL element OLED1 includes pixel electrode PE1 which is formed on the fourth insulating film 14. Pixel electrode PE1 contacts the drain electrode WD of switching element SW1 and is electrically connected to switching element SW1. Similarly, Organic EL element OLED2 includes pixel electrode PE2 which is electrically connected to switching element SW2, and Organic EL element OLED3 includes pixel electrode PE3 which is electrically connected to switching element SW3.

Pixel electrodes PE1 to PE3 function as, for example, positive electrodes. Pixel electrodes PE1 to PE3 may be formed of a transparent conductive material such as indium tin oxide (ITO) and indium zinc oxide (IZO), or may be formed of a metal such as aluminum (Al), magnesium (Mg), silver (Ag), or titanium (Ti), or may be formed of an alloy of these metals. If the Organic EL element is top emission type Organic EL element, pixel electrodes PE1 to PE3 should preferably include a reflective layer which is formed of a metal of high light reflectivity.

Organic EL elements OLED1 to OLED3 each further include an organic luminescent layer ORG and a common electrode CE. The organic luminescent layer ORG is positioned on each of pixel electrodes PE1 to PE3. Furthermore, the organic luminescent layer ORG is formed continuously over Organic EL elements OLED1 to OLED3 without a cut. The common electrode CE is positioned on the organic luminescent layer ORG. Furthermore, the common electrode CE is formed continuously over Organic EL elements OLED1 to OLED3 without a cut. The common electrode CE is formed of a transparent conductive material such as ITO or IZO.

That is, Organic EL element OLED1 is composed of pixel electrode PE1, organic luminescent layer ORG, and common electrode CE. Similarly, Organic EL element OLED2 is composed of pixel electrode PE2, organic luminescent layer ORG, and common electrode CE, and Organic EL element OLED3 is composed of pixel electrode PE3, organic luminescent layer ORG, and common electrode CE.

Note that, in Organic EL elements OLED1 to OLED3, a hole-injection layer and a hole-transport layer may be additionally interposed between each of pixel electrodes PE1 to PE3 and the organic luminescent layer ORG. Furthermore, an electron-injection layer and an electron-transport layer may be interposed between the organic luminescent layer ORG and the common electrode CE.

Organic EL elements OLED1 to OLED3 are partitioned by ribs 15 one from another. The ribs 15 are formed on the fourth insulating film 14 and covers edges of pixel electrodes PE1 to PE3. Note that, although the details are omitted, the rib 15 is formed in, for example, a lattice shape or in a stripe shape on the fourth insulating film 14. The rib 15 is covered with the organic luminescent layer ORG. That is, the organic luminescent layer ORG extends not only over pixel electrodes PE1 to PE3 but also over the rib 15.

In the example depicted, Organic EL elements OLED1 to OLED3 are sealed by a sealing film 20. The sealing film 20 functions as a barrier film which protects Organic EL elements OLED1 to OLED3 from contamination substances such as moisture, oxygen, and hydrogen. The sealing film 20 is formed of an inorganic material such as silicon nitride ($SiN_x$), silicon oxide ($SiO_2$), or silicon oxynitride (SiON) and is formed as a monolayer or a multilayer structure. The sealing film 20 is formed if necessary.

As above, a first multilayer 1 is produced. Here, the first multilayer 1 refers to the layers positioned between the first resin layer 10 and the sealing film 20, and includes the first insulating film 11, switching elements SW1 to SW3, Organic EL elements OLED1 to OLED3, and the like.

The counter-substrate CT is formed of a transparent second resin layer 30. At the inner surface 30A side of the second resin layer 30, the countersubstrate CT includes a fifth insulating film 31, color filter, and the like. The color filter includes blue colored layer 32B, green colored layer 32G, and red colored layer 32R.

The second resin layer 30 is opposed to the first insulating film 11 (first multilayer 1) with the fifth insulating film 31 intervening therebetween. The second resin layer 30 is a transparent insulating layer which is formed of a material mainly including, for example, polyimide (PI). The second resin layer 30 has the thickness basically equal to that of the first resin layer 10 which is, for example, 5 to 30 μm. The second resin layer 30 is formed of a highly transmissive material. This is because Organic EL elements OLED1 to OLED3 of the top emission type emit light which passes through the second resin layer 30.

Thus, the most important characteristics required for the second resin layer 30 are flexibility and high transparency. As can be understood from the above, what is required for the first resin layer 10 and what is required for the second resin layer 30 are different. Thus, the second resin layer 30 may be formed of a material which is different from that of the first resin layer 10. For example, the first resin layer 10 is formed of nontransparent and highly thermal resistive polyimide while the second resin layer 30 is formed of transparent polyimide.

The inner surface 30A of the second resin layer 30 is covered with the fifth insulating film 31. The fifth insulating film 31 is formed on the surface of the second resin layer 30. The fifth insulating film 31 should preferably be formed on the second resin layer 30 with an adhesive force of 0.2 N/mm or less. The adhesive force is obtained through a 90° peeling test. The fifth insulating film 31 functions as a first barrier layer which suppress the ion impurity impingement from and the moisture impingement through the second resin layer 30. The fifth insulating film 31 is formed as a multilayer structure.

The fifth insulating film (second barrier layer) 31 is formed through the same manufacturing process with the same manufacturing conditions as those of the first insulating film (first barrier layer) 11. The fifth insulating film 31 is formed in the same manner as the first insulating film 11. As to the fifth insulating film 31, the layering order of the layers, materials and thicknesses are the same as those of the first insulating film 11. For example, the fifth insulating film 31 is, similarly to the first insulating film 11, formed of a multilayer film including silicon nitride and silicon oxide layered one after another.

Figure 2:
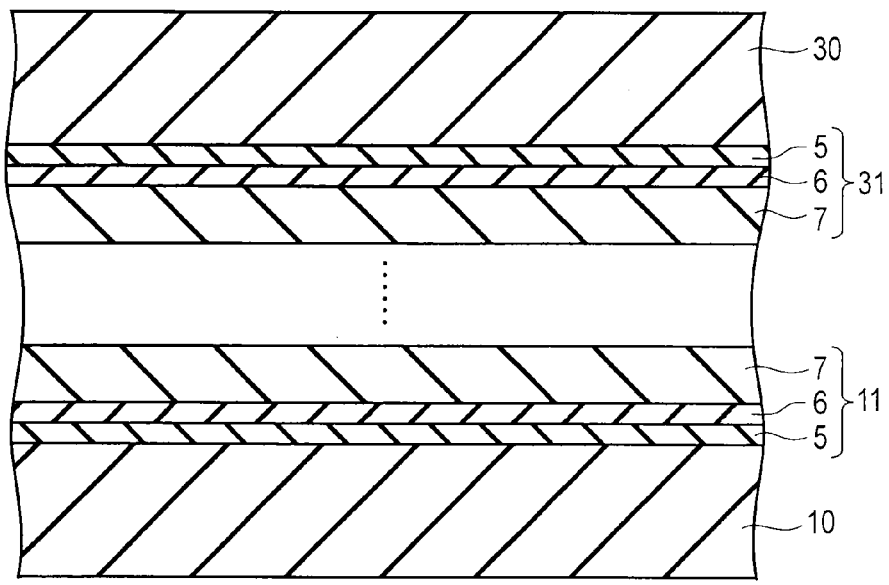
FIG. 2 is a cross-sectional view which schematically shows a part of the structural example of the display device, specifically extracting a first resin layer, first insulating layer, second resin layer, and fifth insulating film.

As shown in FIG. 2, in the embodiment, the first insulating film 11 and the fifth insulating film 31 are composed of three films of a first silicon oxide film 5, silicon nitride film 6, and second silicon oxide film 7.

The first silicon oxide film 5 is formed on the surface of each of the first resin layer 10 and the second resin layer 30 using $SiO_2$. Each first silicon oxide film 5 has the same thickness of, for example, 50 nm. The silicon nitride film 6 is formed on the first silicon oxide film 5 using $SiN_x$. Each silicon nitride film 6 has the same thickness of, for example, 50 nm. The second silicon oxide film 7 is formed on each silicon nitride film 6 using $SiO_2$. Each second silicon oxide film 7 has the same thickness of, for example, 300 nm.

Here, the multilayer structure of the first insulating film 11 and the multilayer structure of the fifth insulating film 31 are symmetrical with respect to, for example, switching elements SW1 to SW3. The first insulating film 11 applies first stress to the display device while the fifth insulating film 31 applies second stress to the display device, and the first stress and the second stress cancel out. Thus, warpage of the display device DA can be suppressed.

Note that, in addition to the above, the first resin layer 10 applies third stress to the display device DA while the second resin layer 30 applies fourth stress to the display device DA, and these third stress and fourth stress should preferably cancel out together. However, the cancellation of the first stress and second stress alone can suppress warpage of the display device DA even if the third stress and the fourth stress do not cancel out. Furthermore, since the cancellation of the first stress and second stress alone can suppress warpage of the display device DA, the display device DA may be formed without the second resin layer 30. This is because the first stress and the second stress are great as compared to the third stress and the second stress.

The blue colored layer 32B is opposed to Organic EL element OLED1 and transmits only the blue light wavelength of the white light. The green colored layer 32G is opposed to Organic EL element OLED2 and transmits only the green light wavelength of the white light. The red colored layer 32R is opposed to Organic EL element OLED3 and transmits only the red light wavelength of the white light. Boundaries of adjacent color layers are positioned above the ribs 15.

As above, a second multilayer 2 is formed. Here, the second multilayer 2 refers to the layers positioned between the second resin layer 30 and the color filters (colored layers 32R, 32G, and 32B) and includes the fifth insulating film 31 and the like.

The array substrate AR (first multilayer 1) and the counter-substrate CT (second multilayer 2) are adhered with each other by a sealing member outside the display section which displays an image and a transparent filler is sealed therebetween. That is, a filler layer 40 is interposed between the array substrate AR (first multilayer 1) and the counter-substrate CT (second multilayer 2).

Organic EL elements OLED1 to OLED3 are positioned between the first resin layer 10 and the second resin layer 30. In the example depicted, the sealing film 20 and the filler layer 40 are interposed between Organic EL element OLED1 and the blue colored layer 32B, between Organic EL element OLED2 and the green colored layer 32G, and between Organic EL element OLED3 and the red colored layer 32R, respectively. The filler layer 40 should preferably be formed of a water absorptive material. This is because, even if there are cracks in the sealing film 20, the filler layer 40 formed of a water-absorptive material will fill in the cracks in the sealing film 20 to shut out water.

Note that, instead of the filler, a water absorptive adhesive agent may be used to adhere the array substrate AR and the countersubstrate CT.

In an Organic EL display device which is an example of the above display device DA, when Organic EL elements OLED1 to OLED3 emit the light individually, each light emitted therefrom (white light) goes externally through one of the blue colored layer 32B, green colored layer 32G, and red colored layer 32R. At that time, only the blue light wavelength out of the white light emitted from Organic EL element OLED1 passes the blue colored layer 32B. Similarly, only the green light wavelength out of the white light emitted from Organic EL element OLED2 passes the green colored layer 32G, and only the red light wavelength out of the white light emitted from Organic EL element OLED3 passes the red colored layer 32R. Therefore, color display can be achieved.

Next, an example of a method of manufacturing the display device DA of the embodiment is explained.

Figure 3:
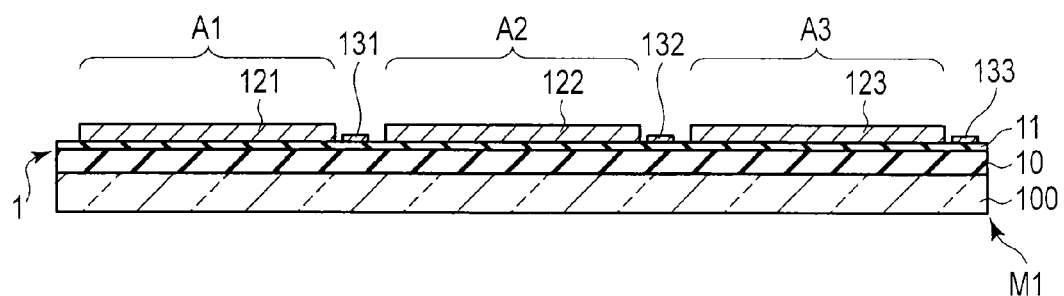
FIG. 3 is a view which shows a method of manufacturing the display device, specifically illustrating a process of preparing a first mother substrate.

As shown in FIG. 3, initially, a first mother substrate M1 is prepared. That is, upon a first supporting substrate 100 which is a glass substrate or the like, a resin material is applied in a desired thickness and is then cured, thereby forming a first resin layer 10. The first resin layer 10 extends in areas to be display sections within individual array substrates formed after a dividing process explained later. In the example depicted, the first resin layer 10 extends to the areas corresponding to three display sections, namely, first area A1, second area A2, and third area A3. Then, a thin film formed of an inorganic material is laminated on the surface of the first resin layer 10 to form a multilayer film which is a first insulating film (first barrier layer) 11. The first insulating film 11 extends to the first area A1, second area A2, and third area A3.

Now, a method of manufacturing the first insulating film 11 of the embodiment is explained.

To start the manufacturing process of the first insulating film 11, the first supporting substrate 100 with the first resin layer 10 is first conveyed into a reaction chamber of a parallel flat plate plasma CVD apparatus. Then, while maintaining the temperature of the first supporting substrate at approximately 400° C., a first silicon oxide film 5 having a thickness of 50 nm, a silicon nitride film 6 having a thickness of 50 nm, and a second silicon oxide film 7 having a thickness of 300 nm are formed on the first resin layer 10 sequentially by switching supply gases into the reaction chamber.

The first silicon oxide film 5 is formed on the first resin layer 10 through a plasma decomposition process of a gaseous mixture of $SiH_4$ and $N_2O$. The silicon nitride film 6 is formed on the first silicon oxide film 5 through a plasma decomposition process of a gaseous mixture of $SiH_4$ and $NH_3$. The second silicon oxide film 7 is formed on the silicon nitride film 6 through a plasma decomposition process of a gaseous mixture of $SiH_4$ and $N_2O$. As can be understood from the above, the first insulating film 11 is manufactured by supplying gaseous $SiH_4$ into the reaction chamber with secondary gases changed suitably.

Then, as shown in FIG. 3, a display element part 121 is formed on the first area A1 of the first insulating film 11, a display element part 122 is formed on the second area A2 on the first insulating film 11, and a display element part 123 is formed on the third area A3 on the first insulating film 11. Furthermore, mount parts 131 to 133 on which signal supply sources such as a driving IC chip and a flexible printed circuit board are mounted are formed on the first insulating film 11. The display element parts 121 to 123 are formed in the same structure and each include a plurality of Organic EL elements arranged in a matrix.

The display element pars 121 to 123 are formed as follows, respectively. That is, switching elements SW1 to SW3, second insulating film 12, third insulating film 13, and fourth insulating film 14 are formed sequentially above the first insulating film 11. At the same time, various interconnects are formed. After pixel electrodes PE1 to PE3 are formed on the fourth insulating film 14, the ribs 15 are formed, and then, the organic luminescent layers ORG are formed, and then, the common electrodes CE are formed. Through these processes, Organic EL elements OLED1 to OLED3 are formed. Then, a sealing film 20 covering Organic EL elements OLED1 to OLED3 is formed if necessary.

In such a manner, the first multilayer 1 including the first insulating film 11, switching element SW1 to SW3, and the like is formed on the first supporting substrate 100.

Figure 4:
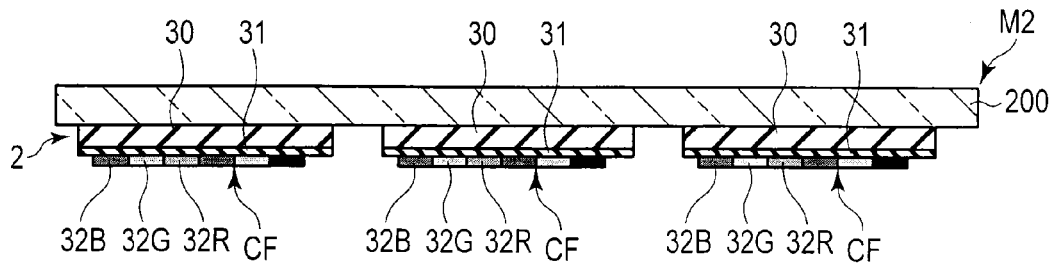
FIG. 4 is a view which shows the method of manufacturing the display device, specifically illustrating a process of preparing a second mother substrate.

Then, as shown in FIG. 4, a second mother substrate M2 is prepared. That is, a second supporting substrate 200 such as a glass substrate or the like is prepared. The second supporting substrate 200 is formed similarly to the first supporting substrate 100. The second supporting substrate 200 is substantially the same as the first supporting substrate 100 with respect to material and thickness. A resin material is applied on the second supporting substrate 200 in a desired thickness and is then cured. Then, the cured resin material formed thereon is patterned using a photolithographic process and the like to produce a transparent second resin layer 30. Second resin layers 30 are separated from each other. That is, each second resin layer 30 is formed in an island shape on the second supporting substrate 200.

Then, a thin film formed of an inorganic material is laminated on the surface of each second resin layer 30 to form a multilayer film, and a fifth insulating film (second barrier layer) 31 is produced. The fifth insulating film 31 is formed through the same manufacturing process with the same manufacturing conditions as those of the first insulating film 11 shown in FIG. 2. The fifth insulating film 31 is formed similarly to the first insulating film 11. The fifth insulating film 31 is substantially the same as the first insulating film 11 with respect to layering order, material, and thickness.

Then, as shown in FIG. 4, a color filter CF is formed on each of the fifth insulating film 31. The color filters CF are formed in the same structure, and each include blue colored layer 32B, green colored layer 32G, and red colored layer 32R.

In such a manner, the second multilayer 2 including the fifth insulating film 31 and the like is formed on the second supporting substrate 200.

Figure 5:
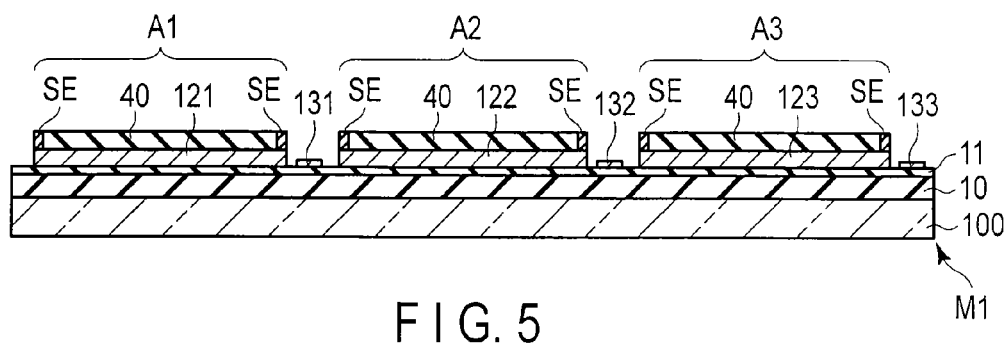
FIG. 5 is a view which shows the method of manufacturing the display device, specifically illustrating a process of applying a sealing material and a filler.

Then, as shown in FIG. 5, a frame-like sealing material is applied on each of the first area A1, second area A2, and third area A3, and then, a filler (or an adhesive agent) is applied inside the area surrounded by the sealing material.

Figure 6:
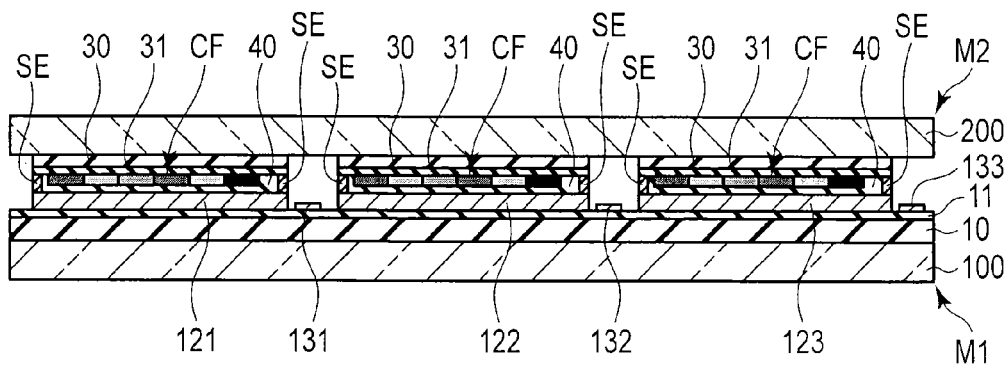
FIG. 6 is a view which shows the method of manufacturing the display device, specifically illustrating a process of attaching the first mother substrate and the second mother substrate.

Then, as shown in FIG. 6, the first multilayer 1 and the second multilayer 2 are arranged opposite to each other such that the multilayer structure of the first insulating film 11 and the multilayer structure of the fifth insulating film 31 are symmetrical with respect to, for example, switching elements SW1 to SW3.

Then, the first mother substrate M1 and the second mother substrate M2 are adhered to each other by the sealing material and the filler. A sealing member SE is formed by curing the sealing material. By curing the filler, a filler layer 40 is formed between the first multilayer 1 and the second multilayer 2. Then, the first multilayer 1 (each of the display element parts 121 to 123) and the second multilayer 2 (each of the color filter layers CF) are adhered to each other by the sealing member SE and the filler layer 40.

Then, as shown in FIG. 7, as to the second mother substrate M2, the second supporting substrate 200 is peeled off and removed from the second resin layer 30. Similarly, as to the first mother substrate M1, the first supporting substrate 100 is peeled off and removed from the first resin layer 10. To the peeling off and removal processes of the first supporting substrate 100 and the second supporting substrate 200, a so-called laser ablation technique can be applied. Laser beam is irradiated toward the supporting substrate to cause local energy absorption at interface of the supporting substrate and the resin layer so that they can be separated. As a light source, excimer laser or the like can be used.

Then, as shown in FIG. 8, the first resin layer 10 is divided. In the example depicted, the first resin layer 10 is divided at two areas between the first area A1 and the second area A2 and between the second area A2 and the third area A3. Consequently, chips C1 to C3 are produced. Chip C1 includes the display element part 121 in the first area A1 and the mount part 131 outside the first area A1. Chip C2 includes the display element part 122 in the second area and the mount part 132 outside the second area A2. Chip C3 includes the display element part 123 in the third area A3 and the mount part 133 outside the third area A3.

Then, the signal supply sources are mounted on each of the mount parts 131 to 133. Consequently, a display device (Organic EL display device) DA of the embodiment is produced.

According to the display device DA and the method of manufacturing the display device DA of the first embodiment, the display device DA comprises the first multilayer 1, second multilayer 2, and filler layer 40. The first multilayer 1 includes the first insulating film 11 formed on the surface of the first resin layer 10, and switching elements SW1 to SW3 formed above the first insulating film 11. The second multilayer 2 includes the fifth insulating film 31. The filler layer 40 is positioned between the first multilayer 1 and the second multilayer 2. The display device DA is formed of the first resin layer 10 and the second resin layer 30 which have excellent flexibility instead of a glass substrate. Therefore, the display device DA having excellent flexibility can be achieved.

The first insulating film 11 can function as a first barrier layer which prevents contamination of switching elements SW1 to SW3, for example. The fifth insulating film 31 can function as a second barrier layer which prevents deterioration of Organic EL elements OLED1 to OLED3. Therefore, the display device DA of excellent reliability can be achieved.

The fifth insulating film 31 is provided above Organic EL elements OLED1 to OLED3 by a so-called transfer process.

When the fifth insulating film 31 is formed, it is first on the second supporting substrate 200 with the second resin layer 30 thereon. As compared to a case where a fifth insulating film 31 is formed on the first supporting substrate 100 on which switching elements SW1 to SW3 and Organic EL elements OLED1 to OLED3 are formed, the limitation to the temperature in the fifth insulating film 31 formation can be much eased in the above case where the fifth insulating film 31 is formed on the second supporting substrate 200. Since the fifth insulating film 31 can be formed in a high temperature environment, the fifth insulating film 31 can be formed finely with excellent barrier performance. Therefore, the display device DA achieved can be much excellent in the reliability.

The fifth insulating film 31 is substantially the same as the first insulating film 11 with respect to layering order, material, and thickness. The first insulating film 11 and the fifth insulating film 31 are symmetrical with respect to, for example, switching elements SW1 to SW3. The first insulating film 11 applies first stress to the display device while the fifth insulating film 31 applies second stress to the display device, and the first stress and the second stress cancel out. Thus, a warpage of the display device DA can be suppressed. Consequently, a display device which sustainably maintains its shape can be achieved.

The fifth insulating film 31 should preferably be formed on the second resin layer 30 with an adhesive force of 0.2 N/mm or less. This is because the second resin layer 30 is easily peeled off from the fifth insulating film 31 after the first multilayer 1 and the second multilayer 2 are adhered to each other.

The first insulating film 11 should preferably be formed on the first resin layer 10 with an adhesive force of 0.2 N/mm or less, too. This is because the first resin layer 10 may be peeled off from the first insulating film 11 after the first multilayer 1 and the second multilayer 2 are adhered to each other, and in that case, the first resin layer 10 is easily peeled off from the first insulating film 11.

The first resin layer 10 is formed on the first supporting substrate 100 preliminarily and the second resin layer 30 is formed on the second supporting substrate 200 preliminarily. The second supporting substrate 200 is substantially the same as the first supporting substrate 100 with respect to material and thickness. Consequently, warpage and the like of a product (the first supporting substrate 100 and the second supporting substrate 200, etc.) during the manufacturing process can be suppressed.

As can be understood from the above, a display device DA of excellent reliability and a method of manufacturing the display device DA can be achieved. Or, a display device DA with excellent sustainability in shape and a method of manufacturing the display device DA can be achieved.

Now, a display device DA of second embodiment is explained. Note that, the above-described method of manufacturing the display device DA of the first embodiment can be partly applied to a method of manufacturing the display device DA of the second embodiment. For example, the method of manufacturing the first insulating film 11 and the fifth insulating film 31 of the first embodiment can be applied to those of a first insulating film 11 and a fifth insulating film 31 of the embodiment.

Figure 9:
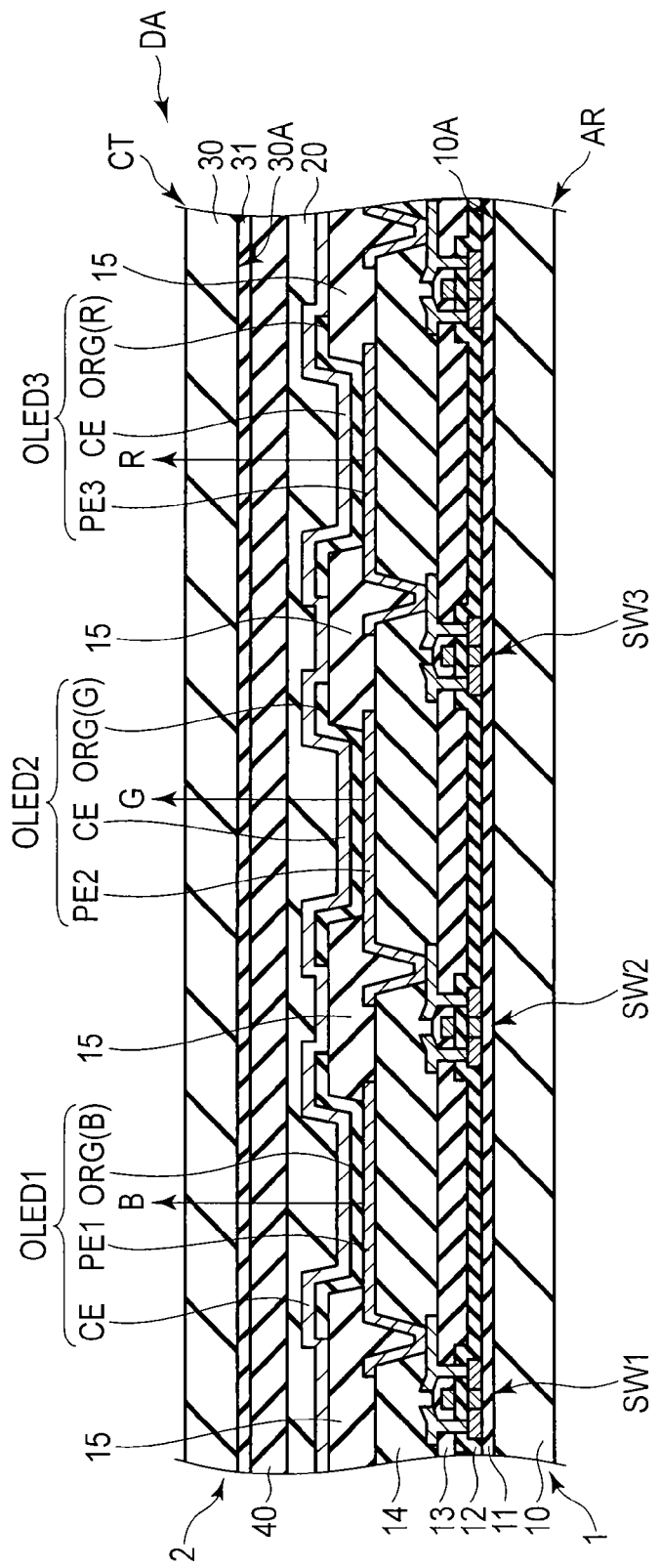
FIG. 9 is a cross-sectional view which schematically shows a structural example of a display device of second embodiment.

FIG. 9 is a cross-sectional view which schematically shows a structural example of the display device DA of the embodiment. In the embodiment, the display device DA is an Organic EL display device as a sheet display.

As shown in FIG. 9, as compared to the display device DA of the first embodiment, the display device DA of the present embodiment does not include color filters in a countersubstrate CT but include Organic EL elements OLED1 to OLED3 which emit light of different colors.

That is, the array substrate AR includes a first resin layer 10, first insulating film 11, second insulating film 12, third insulating film 13, fourth insulating film 14, rib 15, switching elements SW1 to SW3, Organic EL elements OLED1 to OLED3, and sealing film 20.

Organic EL element OLED1 is composed of pixel electrode PE1 connected with switching element SW1, organic luminescent layer ORG(B) positioned above pixel electrode PE1, and common electrode CE positioned above organic luminescent layer ORG(B). Organic EL element OLED2 is composed of pixel electrode PE2 connected with switching element SW2, organic luminescent layer ORG(G) positioned above pixel electrode PE2, and common electrode CE positioned above organic luminescent layer ORG(G). Organic EL element OLED3 is composed of pixel electrode PE3 connected with switching element SW3, organic luminescent layer ORG(R) positioned above pixel electrode PE3, and common electrode CE positioned above organic luminescent layer ORG(R).

Organic luminescent layer ORG(B) emits blue light, organic luminescent layer ORG(G) emits green light, and organic luminescent layer ORG(R) emits red light. Organic luminescent layer ORG(B), organic luminescent layer ORG(G), and organic luminescent layer ORG(R) have a break on each rib 15. The common electrode CE is formed continuously over Organic EL elements OLED1 to OLED3 to cover ribs 15 exposed from the organic luminescent layers without a break.

The counter-substrate CT includes the second resin layer 30 and fifth insulating film 31. The array substrate AR and the counter-substrate CT are attached to each other using a filler layer 40.

According to the display device DA and the method of manufacturing the display device DA of the second embodiment, the display device DA comprises the first multilayer 1, second multilayer 2, and filler layer 40. The first multilayer 1 includes the first insulating film 11 formed on the surface of the first resin layer 10, and switching elements SW1 to SW3 formed above the first insulating film 11. The second multilayer 2 includes the fifth insulating film 31. The filler layer 40 is positioned between the first multilayer 1 and the second multilayer 2.

The fifth insulating film 31 is substantially the same as the first insulating film 11 with respect to layering order, material, and thickness. The layering structure of the first insulating film 11 and the layering structure of the fifth insulating film 31 are symmetrical with respect to, for example, switching elements SW1 to SW3. Thus, the display device DA and the method of manufacturing the same of the present embodiment can achieve the same advantages obtained by the first embodiment.

The colors emitted by Organic EL elements OLED1 to OLED3 may be, for example, red, green, and blue. In that case, the display device DA can emit (display) of red, green, and blue light without the red colored layer 32R, green colored layer 32G, and blue colored layer 32B.

As can be understood from the above, a display device DA of excellent reliability and a method of manufacturing the display device DA can be achieved. Or, the display device DA with excellent sustainability in shape and the method of manufacturing the display device DA can be achieved.

Now, a display device DA of third embodiment is explained. Note that, the above-described method of manufacturing the display device DA of the first embodiment can be partly applied to a method of manufacturing the display device DA of the third embodiment. For example, the method of manufacturing the first insulating film 11 and the fifth insulating film 31 of the first embodiment can be applied to those of a first insulating film 11 and a fifth insulating film 31 of the present embodiment.

Figure 10:
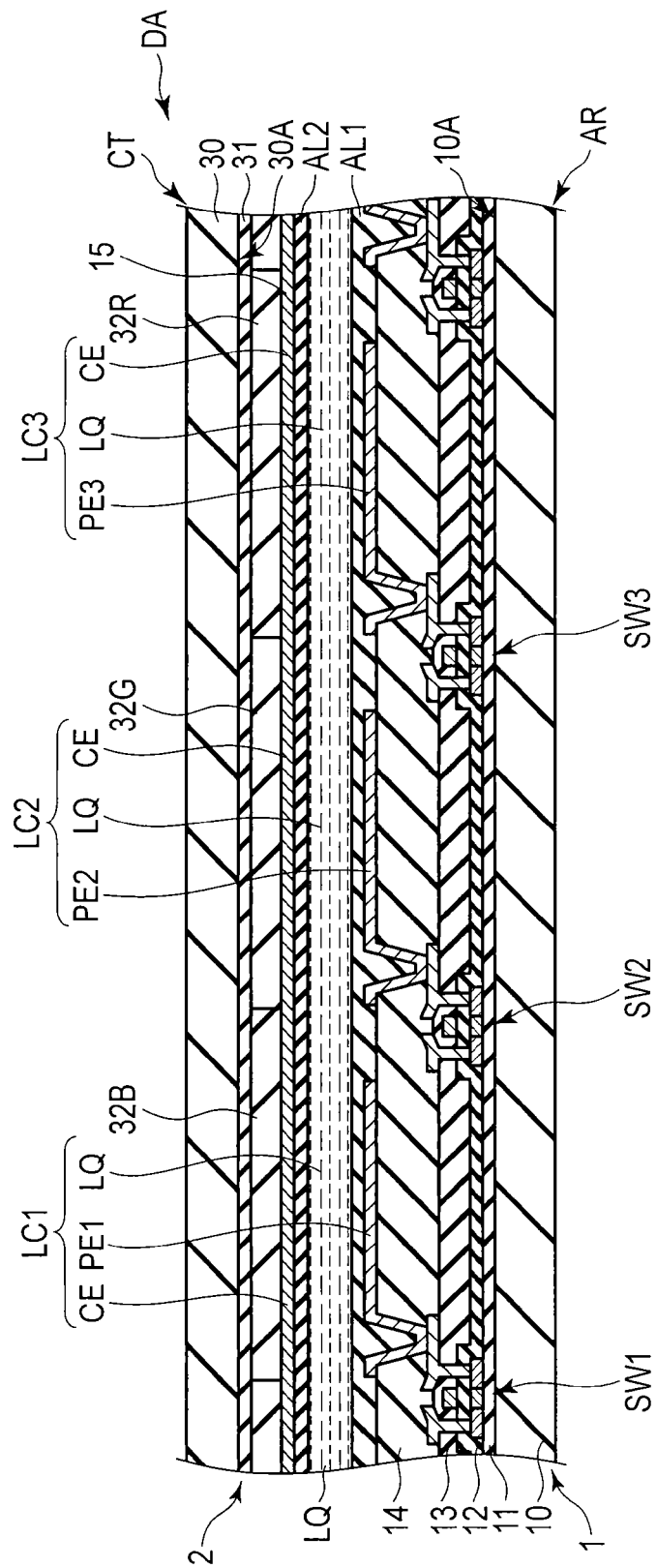
FIG. 10 is a cross-sectional view which schematically shows a structural example of a display device of third embodiment.

FIG. 10 is a cross-sectional view which schematically shows a structural example of the display device DA of the embodiment. In the embodiment, the display device DA is an Organic EL display device as a sheet display.

As shown in FIG. 10, as compared to the display device DA of the first embodiment, the display device DA of the present embodiment includes a liquid crystal element as the display element.

That is, an array substrate AR includes a first resin layer 10, first insulating film 11, second insulating film 12, third insulating film 13, fourth insulating film 14, rib 15, switching elements SW1 to SW3, pixel electrodes PE1 to PE3, and first alignment film AL1. Pixel electrode PE1 is connected with switching element SW1, pixel electrode PE2 is connected with switching element SW2, and pixel electrode PE3 is connected with switching element SW3. The first alignment film AL1 covers pixel electrodes PE1 to PE3. The first alignment film AL1 covers pixel electrodes PE1 to PE3. Here, the first multilayer 1 is a multilayer between the first resin layer 10 and the first alignment film AL1.

The counter-substrate CT includes a second resin layer 30, fifth insulating film 31, blue colored layer 32B, green colored layer 32G, red colored layer 32R, common electrode CE, and second alignment film AL2. The blue colored layer 32B is positioned above pixel electrode PE1, green colored layer 32G is positioned above pixel electrode PE2, and red colored layer 32R is positioned above pixel electrode PE3. Common electrode CE is opposed to each of pixel electrodes PE1 to PE3. The second alignment film AL2 covers the common electrode CE. Here, the second multilayer 2 is a multilayer between the second resin layer 30 and the second alignment film AL2.

The array substrate AR and the countersubstrate CT are adhered to each other by a sealing member with a predetermined gap therebetween by spacers which are not shown. The liquid crystal layer LQ is held in the cell gap between the array substrate AR and the counter-substrate CT. Note that the liquid crystal layer LQ functions as a filler layer positioned between the first multilayer 1 and the second multilayer 2. Although this is not described in detail, the liquid crystal layer LQ includes liquid crystal molecules of which alignment condition is controlled by an electric field between pixel electrode PE and common electrode CE.

Liquid crystal element LC1 is composed of pixel electrode PE1, liquid crystal layer LQ, and common electrode CE. Liquid crystal element LC2 is composed of pixel electrode PE2, liquid crystal layer LQ, and common electrode CE. Liquid crystal element LC3 is composed of pixel electrode PE3, liquid crystal layer LQ, and common electrode CE.

Note that, in the present embodiment, a case where pixel electrodes PE1 to PE3 constituting liquid crystal elements are included in the array substrate AR, and the common electrode CE is included in the countersubstrate CT has been described above; however, no limitation is intended thereby. That is, pixel electrodes PE1 to PE3 and common electrode CE may be all included in the array substrate AR.

According to the display device DA and the method of manufacturing the display device DA of the third embodiment, the display device DA comprises the first multilayer 1, second multilayer 2, and liquid crystal layer LQ. The first multilayer 1 includes the first insulating film 11 formed on the surface of the first resin layer 10, and switching elements SW1 to SW3 formed above the first insulating film 11. The second multilayer 2 includes the fifth insulating film 31. The liquid crystal layer LQ is positioned between the first multilayer 1 and the second multilayer 2.

The fifth insulating film 31 is substantially the same as the first insulating film 11 with respect to layering order, material, and thickness. The layering structure of the first insulating film 11 and the layering structure of the fifth insulating film 31 are symmetrical with respect to, for example, switching elements SW1 to SW3. Thus, the display device DA and the method of manufacturing the same of the present embodiment can achieve the same advantages obtained by the first embodiment.

As can be understood from the above, the display device DA of excellent reliability and the manufacturing method of the display device DA can be achieved. Or, the display device DA with excellent sustainability in shape and the method of manufacturing the display device DA can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the first insulating film 11 and the fifth insulating film 31 may be formed on a surface of a resin layer, namely, the surface of the first resin layer 10, the surface of the second resin layer 30, or the like. A plastic substrate (resin substrate) may be used instead of the first resin layer 10 and the second resin layer 30. In that case, the first insulating film 11 and the fifth insulating film 31 may be formed on the surface of the plastic substrate. Furthermore, a display device DA may be manufactured without the first resin layer 10, second resin layer 10 and plastic substrate. That is, during the manufacturing process of the display device DA, a step of peeling off the first resin layer, second resin layer 30, plastic substrate, and the like may be incorporated.

The first barrier layer and the second barrier layer are not limited to the first insulating film 11 and the fifth insulating film 31, respectively, and various modifications can be adopted. The first barrier layer and the second barrier layer can be modified optionally as long as they both are manufactured through the same processes with the same conditions, are substantially the same with respect to layering order, material, and thickness, and are symmetrical to each other with respect to the switching elements (SW1 to SW3). From these points, the advantages as in the above-described embodiments can be achieved as well.

The embodiments of the present application can be applied to other devices and manufacturing methods than the above-described display device DA and the method of manufacturing the display device DA. The embodiments of the present application may be applied to, for example, other Organic EL display devices (for example, bottom emission type Organic EL display device), other liquid crystal display devices, other display devices (for example, a display device using electrophoresis elements), and manufacturing methods of these display devices. For example, not only diodes (Organic EL diodes) but also various self luminescent display elements can be used as self luminescent elements. Furthermore, the display size is not a matter, that is, the display device DA can be manufactured in a small, medium, or large size.

What is claimed is:

1. A method of manufacturing a display device, the method comprising: forming a first barrier layer on a surface of a first resin layer and a switching element above the first barrier layer, and forming a first multilayer including the first barrier layer and the switching element;

forming a second barrier layer on a surface of a second resin layer through the same manufacturing process with same manufacturing conditions as those of the first barrier layer, the second barrier layer being substantially the same as the first barrier layer with respect to layering order, material, and thickness, and forming a second multilayer including the second barrier layer;

arranging the first multilayer and the second multilayer opposite to each other such that a layering structure of the first barrier layer and a layering structure of the second barrier layer are symmetrical to each other with respect to the switching element; and forming a filler layer between the first multilayer and the second multilayer to adhere the first multilayer and the second multilayer, wherein the first barrier layer includes a first insulating layer and a second insulating layer on the first insulating layer, the second barrier layer includes a third insulating layer and a fourth insulating layer under the third insulating layer, the first insulating layer and the third insulating layer have a same composition and a same thickness, and the second insulating layer and the fourth insulating layer have a same composition and a same thickness.

2. The method of claim 1, further comprising:

peeling off the second resin layer from the second barrier layer after the adhesion of the first multilayer and the second multilayer.

3. The method of claim 1, wherein the first resin layer is formed on a first supporting substrate preliminarily, the second resin layer is formed on a second supporting substrate preliminarily, the second supporting substrate being substantially the same as the first supporting substrate with respect to material and thickness, and peeling off the second supporting substrate from the second resin layer and peeling off the first supporting substrate from the first resin layer after the adhesion of the first multilayer and the second multilayer.

4. A display device comprising:

a first multilayer including a first resin layer, a first barrier layer above the first resin layer, and a switching element above the first barrier layer;

a second multilayer facing the first multilayer and including a second resin layer, a second barrier layer between the second resin layer and the first multilayer; and a filler layer between the first multilayer and the second multilayer, wherein the first barrier layer includes a first insulating layer and a second insulating layer on the first insulating layer, the second barrier layer includes a third insulating layer and a fourth insulating layer under the third insulating layer, the first insulating layer and the third insulating layer have a same composition and a same thickness, and the second insulating layer and the fourth insulating layer have a same composition and a same thickness.

5. The display device of claim 4, wherein the first barrier layer further includes a fifth insulating layer under the first insulating layer, the second barrier layer further includes a sixth insulating layer on the third insulating layer, and the fifth insulating layer and the sixth insulating layer have a same composition and a same thickness.

6. The display device of claim 5, wherein the fifth insulating layer and the sixth insulating layer each include a silicon oxide film.

7. The display device of claim 4, wherein the first insulating layer and the second insulating layer each include a silicon nitride film, and the third insulating layer and the fourth insulating layer each include a silicon oxide film.

8. The display device of claim 4, wherein the second multilayer further comprises an additional resin layer opposed to the first multilayer with the second barrier layer intervening therebetween, and the second barrier layer is formed on the additional resin layer.

9. The display device of claim 8, wherein the second barrier layer is formed on the additional resin layer with an adhesive force of 0.2 N/mm or less.

* * * * *